(12) United States Patent
Starr

(10) Patent No.: US 6,484,293 B1
(45) Date of Patent: Nov. 19, 2002

(54) METHOD FOR DETERMINING OPTIMAL CONFIGURATION FOR MULTINODE BUS

(75) Inventor: Jonathan E. Starr, Santa Clara, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 266 days.

(21) Appl. No.: 09/617,519

(22) Filed: Jul. 14, 2000

(51) Int. Cl.[7] ............................................. G06F 17/50
(52) U.S. Cl. ................................................ 716/2; 326/30
(58) Field of Search .............................. 326/20, 30, 31; 716/2, 13

(56) References Cited

U.S. PATENT DOCUMENTS

| | | | |
|---|---|---|---|
| 4,694,205 A | 9/1987 | Shu et al. ................. 307/530 |
| 4,707,620 A | 11/1987 | Sullivan et al. ............ 307/270 |
| 4,719,369 A | 1/1988 | Asano et al. .............. 307/443 |
| 4,743,784 A | 5/1988 | Obara et al. .............. 307/350 |
| 4,804,871 A | 2/1989 | Walters, Jr. ............... 807/530 |
| 4,831,287 A | 5/1989 | Golab ..................... 307/530 |
| 4,845,675 A | 7/1989 | Krenik et al. ............. 365/203 |
| 4,855,628 A | 8/1989 | Jun ....................... 307/350 |
| 4,859,877 A | 8/1989 | Cooperman et al. ......... 307/443 |
| 4,931,675 A | 6/1990 | Iwata ..................... 307/530 |
| 4,937,479 A | 6/1990 | Hoshi .................... 307/530 |
| 4,959,563 A | 9/1990 | Schenck .................. 307/448 |
| 5,134,311 A | 7/1992 | Biber et al. .............. 307/270 |
| 5,162,672 A | 11/1992 | McMahan et al. .......... 307/443 |
| 5,371,420 A | 12/1994 | Nakao .................... 326/27 |
| 5,457,407 A | 10/1995 | Shu et al. ................ 326/30 |
| 5,602,494 A | 2/1997 | Sundstrom ................ 326/39 |
| 5,615,161 A | 3/1997 | Mu ....................... 365/208 |
| 5,666,078 A | 9/1997 | Lamphier et al. .......... 327/108 |
| 5,726,583 A | 3/1998 | Kaplinsky ................ 326/30 |
| 5,852,579 A | 12/1998 | Arcoleo et al. ........... 365/189.05 |
| 5,990,701 A * | 11/1999 | Starr .................... 326/26 |
| 6,014,508 A * | 1/2000 | Christian et al. ......... 716/13 |
| 6,163,165 A * | 12/2000 | Starr .................... 326/26 |
| 6,232,792 B1 * | 5/2001 | Starr .................... 326/27 |
| 6,323,673 B1 * | 11/2001 | Starr .................... 326/30 |

* cited by examiner

Primary Examiner—John F. Niebling
Assistant Examiner—Stacy A Whitmore
(74) Attorney, Agent, or Firm—Samuel G. Campbell III; Campbell Stephenson Ascolese LLP

(57) ABSTRACT

A Scheme-1 Termination scheme maximizes system signaling rates by minimizing the signal settling-time when the distance from the middle node to the intersection of the transmission lines is much smaller than the sum of the distances from the end nodes to the intersection of the transmission lines. If the distance from the middle node to the intersection of the transmission lines is not much smaller than the sum of the distances from the end nodes to the intersection of the transmission lines, it has been discovered that a Scheme-2 Termination scheme minimizes the signal settling-time. Alternately, when a Scheme-3 Termination scheme is available, the Scheme-3 Termination scheme maximizes system signaling rates by minimizing the signal settling time when the third transmission line length is more than the second transmission line length divided by two. Otherwise a Scheme-1 Termination scheme minimizes the signal settling time. Additionally, for a given termination scheme, the settling time can be changed by adjusting the lengths of the transmission lines. The impact of such adjustments on settling time can be predicted and maximized by following certain formulas.

30 Claims, 2 Drawing Sheets

METHOD FOR DETERMINING OPTIMAL CONFIGURATION FOR MULTINODE BUS

BACKGROUND OF THE INVENTION

1. Field of the Invention

The present invention relates to digital signaling systems and more particularly to controlling the signal settling time of digital signaling systems.

2. Description of the Related Art

In computer and information processing systems, various integrated circuit chips must communicate digitally with each other over common buses. The signal frequency at which this communication occurs can limit the performance of the overall system. Thus the higher the communication frequency, the better. The maximum frequency at which a system communicates is a function not only of the time that it takes for the electromagnetic wavefronts to propagate on the bus from one chip to another, but also of the time required for the signals to settle to levels that can be reliably recognized at the receiving bus nodes as being high or low, referred to as the settling time.

The length of the settling time is a function of the amount of reflection and ringing that occurs on the signal bus. The more effective the termination of a bus system, the smaller the effects of reflection and ringing in the system and the shorter the overall settling time of the signal.

It is known to terminate a bus using a number of different schemes. Three types of termination schemes are referred to as a Scheme-1 Termination scheme, a Scheme-2 Termination scheme and a Scheme-3 Termination scheme. With a 3-node system having a transmission line characteristic impedance of Z ohms everywhere on the line, a middle node is defined as the node having the shortest distance from the intersection of the transmission lines, and the remaining two nodes are defined as end nodes. The middle buffer is defined as the buffer directly associated with the middle node.

A Scheme-1 Termination scheme is characterized as follows. When it is receiving signals, each of the end node output buffers acts as a pull-up terminator (i.e., the end of the transmission line is coupled to the upper power rail via a resistance that is equal to the characteristic impedance of the line) and the middle node output buffer is tri-stated (i.e., functions as an open circuit). When it is driving signals, the output buffer of an end node pulls up through Z ohms and pulls down through Z ohms; the middle node output buffer pulls up through Z ohms and pulls down through Z/2 ohms.

A Scheme-2 Termination scheme is characterized as follows. The output buffer at each node acts as a pull-up terminator when it is receiving signals. When it is driving signals, each node's output buffer pulls up through Z ohms and pulls down through Z/2 ohms.

A Scheme-3 Termination scheme is characterized as follows. With the Scheme-3 Termination Scheme, the transmission lines are coupled to a network of resistors at the intersection rather than being directly connected. The output buffer at each node acts as a pull-up terminator when receiving signals. When it is driving signals, each node's output buffer pulls up through Z ohms and pulls down through a very low resistance to achieve large voltage swings.

It is desirable to determine which termination scheme provides better signaling characteristics, such as minimum settling time, for a particular system geometry. It is also desirable, if constrained to use a particular scheme, to determine how to adjust the lengths of the transmission lines so as to minimize settling time.

SUMMARY OF THE INVENTION

It has been discovered that a Scheme-1 Termination scheme will maximize system signaling rates by minimizing the signal settling-time when the distance from the middle node to the intersection of the transmission lines is much smaller than the sum of the distances from the end nodes to the intersection of the transmission lines. If the distance from the middle node to the intersection of the transmission lines is not much smaller than the sum of the distances from the end nodes to the intersection of the transmission lines, it has been discovered that a Scheme-2 Termination scheme will minimize the signal settling-time.

Alternately, when a Scheme-3 Termination scheme is available, the Scheme-3 Termination scheme maximizes system signaling rates by minimizing the signal settling time when the third transmission line length is more than the second transmission line length divided by two. Otherwise a Scheme-1 Termination scheme minimizes the signal settling time.

More specifically, in one aspect, the invention relates to a method of selecting a termination scheme between a first scheme and a second scheme to minimize signal settling time in a three node system having first, second and third transmission lines connected at a junction. The method includes: determining a first transmission line length of the first transmission line; determining a second transmission line length of the second transmission line; determining a third transmission line length of the third transmission line, the first transmission line length being greater than the second transmission line length and the second transmission line length being greater than the third transmission line length; selecting the first termination scheme if the third transmission line length is short relative to the combination of the first transmission line length plus the second transmission line length, otherwise selecting the second termination scheme.

In another aspect, the invention relates to a method of selecting a termination scheme from a first termination scheme, a second termination scheme and a third termination scheme to minimize signal settling time in a three node system having first, second and third transmission lines connected at a junction. The method includes: determining a first transmission line length of the first transmission line; determining a second transmission line length of the second transmission line; determining a third transmission line length of the third transmission line; selecting the first termination scheme if the third transmission line length is less than half of the second transmission line length otherwise selecting the third termination scheme.

In another aspect, the invention relates to a method of adjusting line lengths in a three node system to minimize signal settling time. The method includes: determining whether a first termination scheme, a second termination scheme or a third termination scheme is used by the three node system; determining a first transmission line length of a first transmission line; determining a second transmission line length of a second transmission line; determining a third transmission line length of a third transmission line, the first transmission line length being greater than the second transmission line length and the second transmission line length being greater than the third transmission line length; adjusting, when the first termination scheme is used, the first transmission line length, the second transmission line length and the third transmission line length to minimize the sum of two times the first transmission line length plus four times the third transmission line length; adjusting, when the second termination scheme is used, the first transmission line length, the second transmission line length and the third transmission line length to minimize the sum of three times the first transmission line length plus the second transmission line length; and, adjusting, when the third termination scheme is used, the first transmission line length, the second transmission line length and the third transmission line length to minimize the sum of the first transmission line length plus the second transmission line length. These formulas for the effects of such adjustments on settling time assume that, following such adjustments, the first transmission line length remains greater than the second transmission line length, and the second transmission line length remains greater than the third transmission line length.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
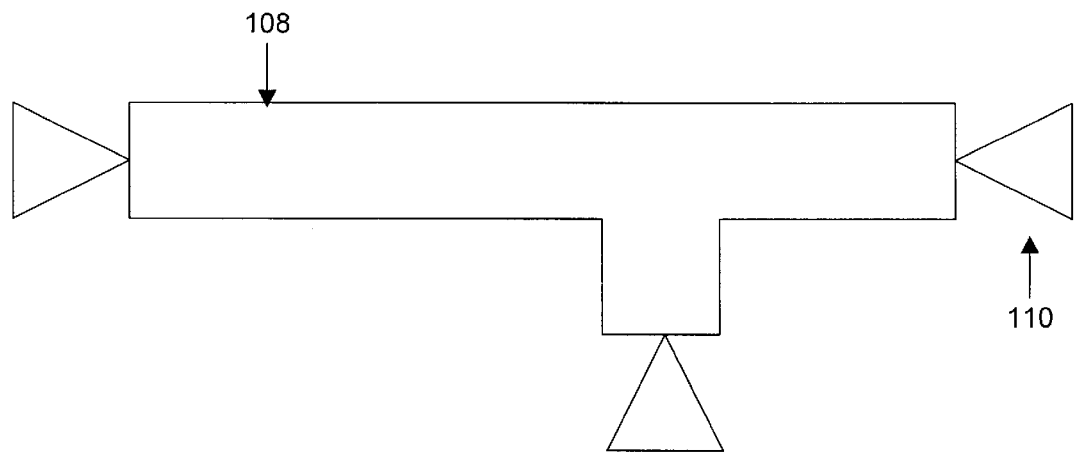
FIG. 1 is a block diagram of a three node system.

Referring to FIG. 1, the analysis of the settling times for a given signal is discussed herein. On a three node bus 108, each node is coupled to a push pull driver 110, the output impedance of which is controllable. When pulling up, the driver 110 functions as a resistive connection between the end of the transmission line and the power supply rail. The power supply rail is labeled VDD. When pulling down, the driver functions as a resistive connection between the end of the transmission line and the "ground" rail. The ground rail is assumed to be zero volts. The analysis of the drivers 110 relates to drivers which use a Scheme-1 Termination scheme compared with drivers which use a Scheme-2 Termination scheme.

Figure 2:
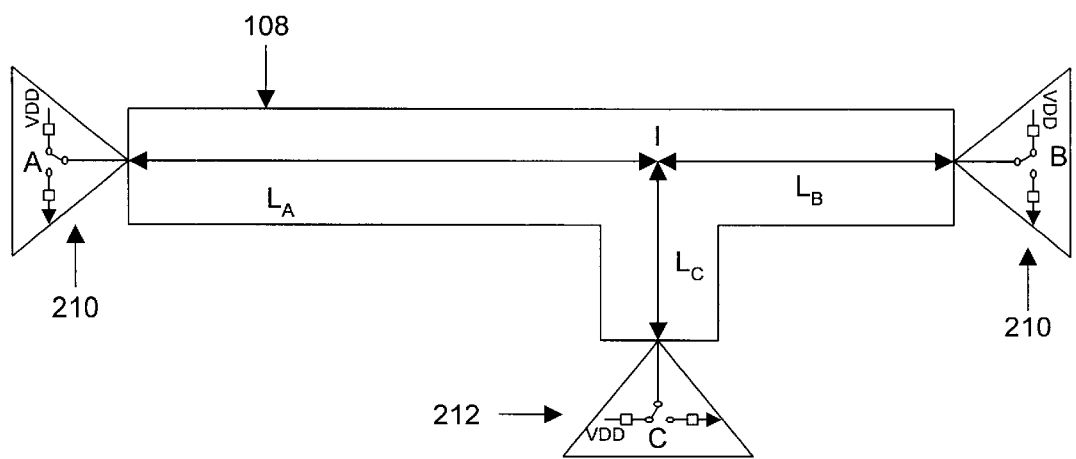
FIG. 2 is a block diagram of a three node system, with the buffers, transmission line lengths, and transmission line characteristics identified.

Referring to FIG. 2, The driver nodes are set forth as end nodes A and B and middle node C. Point I is the intersection of the transmission lines which combine to form bus 108. The lengths from a node to the intersection I are set forth as $L_A$, $L_B$ and $L_C$. The propagation times from a node to the intersection I are set forth as $t_A$, $t_B$ and $t_C$. It will be assumed that propagation-velocity is the same in all parts of the transmission-line, so that relative magnitudes of delays $t_A$, $t_B$ and $t_C$ are directly correlated with the relative magnitudes of the corresponding signal-trace lengths. It will be further assumed that $L_A > L_B > L_C$.

In operation, when the system is driven high, the final voltage value at all three nodes is VDD. When driven low, the final voltage value is 0.5*VDD. However, because of reflections within each system, for some signal switches, the system requires an infinite amount of time to reach its theoretical voltage value. Accordingly, a system is considered to be "settled" when no individual signal still propagating on the transmission-line can cause a change in the voltage at any of the three nodes in the system by more than five percent of VDD (i.e. 0.05*VDD).

Since all nodes of Scheme-2 Termination scheme are equivalent in their functioning, the assignment of trace-lengths $L_A$, $L_B$ and $L_C$ to the three nodes is arbitrary. For Scheme-1 Termination scheme, it will be seen that signal settling may require many transitions of the trace connected to the middle-node. Therefore, the settling-time for Scheme-1 Termination will be minimized if the shortest trace, $L_C$, is assigned to the middle node. The assignment of buffers A and B to the two end nodes is arbitrary, since they are equivalent in their functioning.

The reflection coefficient at intersection I is set forth as [(Z0/2)−Z0]/[(Z0/2)+Z0]=−0.333. The transmission coefficient at intersection I is set forth as [2*(Z0/2)]/[(Z0/2)+Z0]=+0.667.

The reflection coefficients for signals propagating on the transmission-line that impinge on the interface between an end of the transmission line and a respective driver 110 for a Scheme-1 Termination scheme are: [(Z0/2)−Z0]/[Z0/2)+Z0]−0.333, when middle buffer 212 is driving low; [Z0−Z0]/[Z0+Z0]=0 (terminates), when any buffer is driving high, when the end buffers 210 are driving low, or when the end buffers 210 are receiving; and [infinity−Z0]/[infinity+Z0]=1 (buffer tri-stated) when middle buffer 212 is receiving.

The reflection coefficients for signals propagating on the transmission-line that impinge on the interface between an end of the transmission line and a respective driver 110 for a Scheme-2 Termination scheme are: [(Z0/2)−Z0]/[Z0/2)+Z0]=−0.333, when any buffer is driving low and [Z0−Z0]/[Z0+Z0]=0 (terminates), when any buffer is driving high or when any buffer is receiving.

The signal settling times per switching scenario will now be discussed. Because end nodes 210 are interchangeable, any analysis involving one end node is applicable to the other end node. The switching scenarios are dependent upon the termination scheme as well as actions of individual buffers within the termination scheme. Furthermore, signals may be transmitted in uni-directional mode, where a single output-buffer launches a stream of signals, or in bus-turnaround mode, where the output buffer that had previously been sending signals goes into receive-mode, and another output-buffer that had previously been in receive-mode begins sending signals. For bus-turnaround mode, it will be assumed that the second output-buffer goes into drive-mode on the same clock edge that the first output-buffer goes into receive-mode.

Scheme-1 Termination Scheme Switching Scenarios, Uni-directional Mode

When end buffer 210 switches from pulling high to pulling low the settling time is $2t_A + 4t_C$.

More Specifically, buffer A switches, launching a signal-edge of −0.500*Vdd towards the I intersection. After time $t_A$, the −0.500*Vdd edge arrives at intersection I. The amount reflected back towards A is −0.333*(−0.500)*Vdd=+0.167*Vdd, and the amount transmitted towards B and C is +0.667*(−0.500)*Vdd=−0.333*Vdd.

After time $t_A + t_A = 2t_A$, the +0.167*Vdd edge arrives at A and terminates. After time $t_A + t_B$, the −0.333*Vdd propagating towards B arrives there and terminates. After time $t_A + t_C$, the −0.333*Vdd propagating towards C arrives there and reflects. The amount reflected back towards intersection I is −0.333*Vdd (since the reflection coefficient of buffer C=1 in this case).

After time $t_A + t_C + t_C$ $t_A + 2t_C$, the −0.333*Vdd edge arrives at the I intersection. The amount reflected back towards C is −0.333*(−0.333)*Vdd=+0.111*Vdd, and the amount transmitted towards A and B is +0.667*(−0.333)*Vdd=−0.222*Vdd.

After time $t_A+2t_C+t_A=2t_A+2t_C$, the −0.222*Vdd propagating towards A arrives there and terminates. After time $t_A+2t_C+t_B$, the −0.222*Vdd edge propagating towards B arrives there and terminates. After time $t_A+2t_C+t_C=t_A+3t_C$, the +0.111*Vdd edge propagating towards C arrives and reflects. The amount reflected back towards intersection I is +0.111*Vdd.

After time $t_A+3t_C+t_C=t_A+4t_C$, the +0.111*Vdd edge arrives at intersection I. The amount reflected back towards C is −0.333*(+0.111)*Vdd=−0.037*Vdd. The amount transmitted towards A and B is +0.667*(+0.111)*Vdd=+0.074*Vdd.

After time $t_A+4t_C+t_A=2t_A+4t_C$, the +0.074*Vdd propagating towards A arrives there and terminates. After time $t_A+4t_C+t_B$, the +0.074*Vdd edge propagating towards B arrives there and terminates. After time $t_A+4t_C+t_C=t_A+5t_C$, the −0.037*Vdd edge propagating towards C arrives and reflects. The amount reflected back towards intersection I is −0.037*Vdd.

Now there is no signal left propagating that can change the voltage at any node by as much as 0.050*Vdd. Therefore, the line is defined as being settled. Since $(2t_A+4t_C)>(t_A+4t_C+t_B)>(t_A+5t_C)$, the maximum settling time is $2t_A+4t_C$.

If buffer B were the one to switch, a similar analysis would yield corresponding settling times of $(2t_B+4t_C)$, $(t_B+4t_C+t_A)$, and $(t_B+5t_C)$. All of these are less than $2t_A+4t_C$. So, the settling time for this type of switching is $2t_A+4t_C$.

When end buffer 210 switches from pulling low to pulling high the settling time is $2t_A+4t_C$.

More specifically, buffer A switches, launching a signal-edge of +0.500*Vdd towards intersection I. The analysis is identical to that in which an end-buffer switches from pulling high to pulling-low, only with the polarities of the edges reversed. So, the settling time for this type of switching is $2t_A+4t_C$.

When middle buffer 212 switches from pulling high to pulling low the settling time is $t_A+3t_C$.

More specifically, buffer C switches, launching a signal-edge of −0.667*Vdd towards intersection I.

After time $t_C$, the −0.667*Vdd edge arrives at intersection I. The amount reflected back towards C is −0.333*(−0.667)*Vdd=+0.222*Vdd, and the amount transmitted towards A and B is +0.667*(−0.667)*Vdd=−0.444*Vdd.

After time $t_C+t_A$, the −0.444*Vdd edge propagating towards A arrives there and terminates. After time $t_C+t_B$, the −0.444*Vdd edge propagating towards B arrives there and terminates. After time $t_C+t_C=2t_C$, the +0.222*Vdd edge propagating towards C arrives there and reflects. The amount reflected back towards intersection I is −0.333*(+0.222)*Vdd=−0.074*Vdd (since the reflection coefficient for buffer C is −0.333 in this case).

After time $2t_C+t_C=3t_C$, the −0.074*Vdd edge arrives at intersection I. The amount reflected back towards C is −0.333*(−0.074)*Vdd=+0.025*Vdd, and the amount transmitted towards A and B is +0.667*(−0.074)*Vdd=−0.050*Vdd.

After time $3t_C+t_A$, the −0.050*Vdd edge propagating towards A arrives there and terminates. After time $3t_C+t_B$, the −0.050*Vdd edge propagating towards B arrives there and terminates. After time $3t_C+t_C=4t_C$, the +0.025*Vdd edge propagating towards C arrives and reflects. The amount reflected back towards intersection I is −0.333*(+0.025)*Vdd=−0.008*Vdd.

Now there is no signal left propagating that can change the voltage at any node by as much as 0.050*Vdd. Therefore, the line is defined as being settled. Since $(t_A+3t_C)>(t_B+3t_C)>(4t_C)$, the settling time for this type of switching is $t_A+3t_C$.

When middle buffer 212 switches from pulling low to pulling high the settling time is $t_A+t_C$.

More specifically, buffer C switches, launching a signal-edge of +0.750*Vdd towards intersection I. After time $t_C$, the +0.750*Vdd edge arrives at intersection I. The amount reflected back towards C is −0.333*(+0.750)*Vdd=−0.250*Vdd, and the amount transmitted towards A and B is +0.667*(+0.750)*Vdd=+0.500*Vdd.

After time $t_C+t_A$, the +0.500*Vdd edge propagating towards A arrives there and terminates. After time $t_C+t_B$, the +0.500*Vdd edge propagating towards B arrives there and terminates. After time $t_C+t_C=2t_C$, the −0.250*Vdd edge propagating towards C arrives there and terminates (since the reflection coefficient for buffer C is 0 in this case).

Now there is no signal left propagating. Therefore, the line is defined as being settled. Since $(t_A+t_C)>(t_B+t_C)>(2t_C)$, the settling time for this type of switching is: $t_A+t_C$.

Scheme-1 Termination Scheme Switching Scenarios, Bus-turnaround Mode

When end buffer 210 switches from pulling high to receive mode, and the other end buffer 210 switches from receive mode to pulling high, neither switch launches a signal and the settling time is 0.

When end buffer 210 switches from pulling high to receive mode, and the other end buffer 210 switches from receive mode to pulling low, the end buffer switching from pulling high to receive mode does not launch a signal. The end-buffer switching from receive-mode to pulling low has the same analysis as when an end buffer switches from pulling high to pulling low in uni-directional mode. So, the settling time is $2t_A+4t_C$.

When end buffer 210 switches from pulling high to receive mode, and middle buffer 212 switches from receive mode to pulling high, neither switch launches a signal. So the settling time is 0.

When end buffer 210 switches from pulling high to receive mode, and middle buffer 212 switches from receive mode to pulling low, the settling time is $t_A+3t_C$. More specifically, end-buffer 210 switching from pulling high to receive mode does not launch a signal, and the middle buffer switching from receive mode to pulling low has the same analysis as when the middle buffer switches from pulling high to pulling low in unidirectional mode. So, the settling time is $t_A+3t_C$.

When middle buffer 212 switches from pulling high to receive mode, and end buffer 210 switches from receive mode to pulling high, neither switch launches a signal and the settling time is 0.

When middle buffer 212 switches from pulling high to receive mode, and end buffer 210 switches from receive mode to pulling low, the settling time is $2t_A+4t_C$. More specifically, middle buffer 212 switching from pulling high to receive mode launches no signal, and the end buffer 210 switching from receive mode to pulling low has the same analysis as when end buffer 210 switches from pulling high to pulling low in uni-directional mode. So, the settling time is $2t_A+4t_C$.

When end buffer 210 switches from pulling low to receive mode, and the other end buffer 210 switches from receive mode to pulling high, the settling time is $2t_A+4t_C$. More specifically, the end-buffer switching from pulling low to receive mode has the same analysis as when end buffer 210 switches from pulling low to pulling high in uni-directional mode, and the other end buffer 210 switching from receive mode to pulling high does not launch a signal. So, the settling-time is $2t_A+4t_C$.

When end buffer 210 switches from pulling low to receive mode, and the other end buffer 210 switches from receive mode to pulling low, the settling time is $2t_A+4t_C$. More specifically, the end-buffer switching from pulling low to receive mode has the same analysis as when end-buffer switches from pulling low to pulling high in uni-directional mode and the other end buffer 210 switching from receive-mode to pulling low has the same analysis as when an end buffer 210 switches from pulling high to pulling low in unidirectional mode. So, the settling-time is $2t_A+4t_C$.

When end buffer 210 switches from pulling low to receive mode, and middle buffer 212 switches from receive mode to pulling high, the settling time is $2t_A$.

More specifically, end buffer A switches from pulling low to receive-mode, launching a signal-edge of +0.500*Vdd towards intersection I. After time $t_A$, the +0.500*Vdd edge arrives at intersection I. The amount reflected back toward A is $-0.333*(+0.500)*Vdd$ $-0.167*Vdd$, and the amount transmitted towards B and C is $+0.667*(+0.500)*Vdd+0.333*Vdd$.

After time $t_A+t_A=2t_A$, the −0.167*Vdd edge propagating towards A arrives there and terminates. After time $t_A+t_B$, the +0.333*Vdd edge propagating towards B arrives there and terminates. After time $t_A+t_C$, the +0.333*Vdd edge propagating towards C arrives there and terminates (since the reflection coefficient for buffer C is 0 in this case).

Now there is no signal left propagating. Therefore, this signal is defined as being settled. Since $(2t_A)>(t_A+t_B)>(t_A+t_C)$, the settling time for this type of switching is $2t_A$.

If end buffer B had been the one that switched, the corresponding settling times would have been $(2t_B)$, $(t_A+t_B)$, $(t_B+t_C)$, all of which are less than $(2t_A)$. So, the settling time is still $2t_A$.

Middle buffer C switches from receive mode to pulling high, launching a signal-edge of +0.250*Vdd towards intersection I. After time $2t_C$, the +0.250*VDD edge arrives at intersection I. The amount reflected back towards C is $-0.333*(+0.250)*Vdd$ $-0.083*Vdd$, and the amount transmitted towards A and B is $+0.667(+0.250)*Vdd=+0.167*Vdd$.

After time $t_C+t_A$, the +0.167*Vdd edge propagating towards A arrives there and terminates. After time $t_C+t_B$, the +0.167*Vdd edge propagating towards B arrives there and terminates. After time $t_C+t_C=2t_C$ the −0.083*Vdd edge propagating towards C arrives there and terminates (since the reflection coefficient of buffer C is 0 in this case).

Now there is no signal left propagating. Therefore, this signal is defined as being settled. Since $(t_A+t_C)>(t_B+t_C)>(2t_C)$, the settling time for this switch is $t_A+t_C$.

The overall settling time for this bus-turnaround switching is the longer of the two settling times, $(2t_A)$ and $(t_A+t_C)$. Therefore, the settling time for this type of bus-turnaround switching is $2t_A$.

When end buffer 210 switches from pulling low to receive mode, and middle buffer switches from receive mode to pulling low, the settling time is $2t_A+2t_C$.

More specifically, end buffer A switches from pulling low to receive mode, launching a signal-edge of +0.500*Vdd towards intersection I. After time $t_A$, the +0.500*Vdd edge arrives at intersection I. The amount reflected back towards A is $-0.333*(+0.500)*Vdd=-0.167*Vdd$, and the amount transmitted towards B and C is $+0.667*(+0.500)*Vdd=+0.333*Vdd$.

After time $t_A+t_A=2t_A$, the −0.167*Vdd edge arrives at A and terminates. After time $t_A+t_B$, the +0.333*Vdd edge propagating towards B arrives there and terminates. After time $t_A+t_C$, the +0.333*Vdd edge propagating towards C arrives there and reflects. The amount reflected back towards intersection I is $-0.333*(+0.333)*Vdd=-0.111*Vdd$ (since the reflection coefficient of buffer C is −0.333 in this case).

After time $t_A+t_C+t_C=t_A+2t_C$, the −0.111*Vdd edge arrives at the intersection I. The amount reflected back towards C is $-0.333*(-0.111)*Vdd=+0.037*Vdd$, and the amount transmitted towards A and B is $+0.667*(-0.111)*Vdd=-0.074*Vdd$.

After time $t_A+2t_C+t_A=2t_A+2t_C$, the −0.074*Vdd propagating towards A arrives and terminates. After time $t_A+2t_C+t_B$, the −0.074*Vdd edge propagating towards B arrives there and terminates. After time $t_A+2t_C+t_C=t_A+3t_C$, the +0.037*Vdd edge propagating towards C arrives and reflects. The amount reflected back towards intersection I is $-0.333*(+0.037)*Vdd=0.012*Vdd$.

Now there is no signal left propagating that can change the voltage at any node by as much as 0.050*Vdd. Therefore, this signal is defined as being settled. Since $(2t_A+2t_C)>(t_A+2t_C+t_B)>(t_A+3t_C)$, the maximum settling time is $2t_A+2t_C$.

If buffer B were the one to switch, a similar analysis would yield corresponding settling times of $(2t_B+2t_C)$, $(t_B+2t_C+t_A)$, $(t_B+3t_C)$. All of these are less than $(2t_A+2t_C)$. So, the settling time for the signal launched by the end-buffer switching is $2t_A+2t_C$.

Middle buffer C switches from receive-mode to pulling low, launching an edge of −0.333*Vdd towards intersection I. After time $t_C$ the −0.333*Vdd edge arrives at intersection I. The amount reflected back towards C is $-0.333*(-0.333)*Vdd=+0.111*Vdd$, and the amount transmitted towards A and B is $+0.667*(-0.333)*Vdd=-0.222*Vdd$.

After time $t_C+t_A$, the −0.222*Vdd edge propagating towards A arrives there and terminates. After time $t_C+t_B$, the −0.222*Vdd edge propagating towards B arrives there and terminates. After time $t_C+t_C=2t_C$, the +0.111*Vdd edge propagating towards C arrives there and reflects. The amount reflected back towards intersection I is $-0.333*(+0.111)*Vdd=-0.037*Vdd$ (since the reflection coefficient of buffer C is −0.333 in this case).

Now there is no signal left propagating that can change the voltage at any node by as much as 0.050*Vdd. Therefore, this signal is defined as being settled. Since $(t_A+t_C)>(t_B+t_C)>(2t_C)$, the settling time for this type of switching is $t_A+t_C$.

The overall settling time for this bus-turnaround switching is the longer of the two settling times, $(2t_A+2t_C)$ and $(t_A+t_C)$. Therefore, the settling time for this type of switching is $2t_A+2t_C$.

When middle buffer 212 switches from pulling low to receive mode, and end buffer 210 switches from receive mode to pulling high, the settling time is $t_A+5t_C$.

More specifically, middle buffer C switches from pulling low to receive mode, launching a signal-edge of +1.000*Vdd towards intersection I. After time $t_C$, the +1.000*Vdd edge arrives at intersection I. The amount reflected back towards C is $-0.333*(+1.000)*Vdd$ $-0.333*Vdd$, and the amount transmitted towards A and B is $+0.667*(+1.000)*Vdd=+0.667*Vdd$.

After time $t_C+t_A$, the +0.667*Vdd edge propagating towards A arrives there and terminates. After time $t_C+t_B$, the +0.667*Vdd edge propagating towards B arrives there and terminates. After time $t_C+t_C=2t_C$, the −0.333*Vdd edge propagating towards C arrives there and reflects. The amount reflected back towards intersection I is $1*(-0.333)*Vdd -0.333*Vdd$ (since the reflection coefficient of buffer C is 1 in this case).

After time $2t_C+t_C=3t_C$, the $-0.333*Vdd$ edge arrives at the intersection I. The amount reflected back towards C is $-0.333*(-0.333)*Vdd=+0.111*Vdd$, and the amount transmitted towards A and B is $+0.667*(-0.333)*Vdd=-0.222*Vdd$.

After time $3t_C+t_A$, the $-0.222*Vdd$ edge propagating towards A arrives there and terminates. After time $3t_C+t_B$, the $-0.222*Vdd$ edge propagating towards B arrives there and terminates. After time $3t_C+t_C=4t_C$, the $+0.111*Vdd$ edge propagating towards C arrives and reflects. The amount reflected back towards intersection I is $1*(+0.111)*Vdd=+0.111*Vdd$.

After time $4t_C+t_C=5t_C$, the $+0.111*Vdd$ edge arrives at intersection I. The amount reflected back towards C is $-0.333*(+0.111)*Vdd=-0.037*Vdd$, and the amount transmitted towards A and B is $+0.667*(+0.111)*Vdd=+0.074*Vdd$.

After time $5t_C+t_A$, the $+0.074*Vdd$ edge propagating towards A arrives there and terminates. After time $5t_C+t_B$, the $+0.074*Vdd$ edge propagating towards B arrives there and terminates. After time $5t_C+t_C=6t_C$, the $=0.037*Vdd$ edge propagating towards C arrives there and reflects. The amount reflected back towards intersection I is $1*(-0.037)*Vdd=-0.037*Vdd$.

Now there is no signal left propagating that can change the voltage at any node by as much as $0.050*Vdd$. Therefore, this signal is defined as being settled. Since $(t_A+5t_C)>(t_B+5t_C)>(6t_C)$, the settling time for this type of switching is $(t_A+5t_C)$.

The End-Buffer switch does not launch a signal. So, the overall settling time for this bus-turnaround switching is $t_A+5t_C$.

When middle buffer 212 switches from pulling low to receive mode, and end buffer 210 switches from receive mode to pulling low, the settling time is $2t_A+4t_C$.

More specifically, the analysis for middle buffer C switching is the same as when the middle buffer switches from pulling low to receive mode in bus-turnaround mode with end buffer 210 switching from receive mode to pulling high, so the settling time for this signal is $t_A+5t_C$.

End buffer A switches from receive mode to pulling low, launching a signal-edge of $-0.500*Vdd$ towards intersection I. After time $t_A$, the $-0.500*Vdd$ edge arrives at intersection I. The amount reflected back towards A is $-0.333*(-0.500)*Vdd=+0.167*Vdd$, and the amount transmitted towards B and C is $+0.667*(-0.500)*Vdd=-0.333*Vdd$.

After time $t_A+t_A=2t_A$, the $+0.167*Vdd$ edge arrives at A and terminates. After time $t_A+t_B$, the $-0.333*Vdd$ edge propagating towards B arrives there and terminates. After time $t_A+t_C$, the $-0.333*Vdd$ edge propagating towards C arrives there and reflects. The amount reflected back towards intersection I is $1*(-0.333)*Vdd=-0.333*Vdd$ (since the reflection coefficient of buffer C is 1 in this case).

After time $t_A+t_C+t_C=t_A+2t_C$, the $-0.333*Vdd$ edge arrives at the intersection I. The amount reflected back towards C is $-0.333*(-0.333)*Vdd=+0.111*Vdd$, and the amount transmitted towards A and B is $+0.667*(-0.333)*Vdd=-0.222*Vdd$.

After time $t_A+2t_C+t_A=2t_A+2t_C$, the $-0.222*Vdd$ edge propagating towards A arrives and terminates. After time $t_A+2t_C+t_B$, the $-0.222*Vdd$ edge propagating towards B arrives there and terminates. After time $t_A+2t_C+t_C=t_A+3t_C$, the $+0.111*Vdd$ edge propagating towards C arrives there and reflects. The amount reflected back towards intersection I is $1*(+0.111)*Vdd=+0.111*Vdd$.

After time $t_A+3t_C+t_C=t_A+4t_C$, the $+0.111*Vdd$ edge arrives at intersection I. The amount reflected back towards C is $-0.333*(+0.111)*Vdd=-0.037*Vdd$, and the amount transmitted towards A and B is $+0.667*(+0.111)*Vdd=+0.074*Vdd$.

After time $t_A+4t_C+t_A=2t_A+4t_C$, the $+0.074*Vdd$ edge propagating towards A arrives there and terminates. After time $t_A+4t_C+t_B$, the $+0.074*Vdd$ edge propagating towards B arrives there and terminates. After time $t_A+4t_C+t_C=t_A+5t_C$, the $-0.037*Vdd$ edge propagating towards C arrives and reflects. The amount reflected back towards intersection I is $1*(-0.037)*Vdd=-0.037*Vdd$.

Now there is no signal left propagating that can change the voltage at any node by as much as $0.050*Vdd$. Therefore, this signal is defined as being settled. Since $(2t_A+4t_C)>(t_A+4t_C+t_B)>(t_A+5t_C)$, the settling time for this type of switching is: $2t_A+4t_C$.

Now, comparing the settling times for middle buffer 212 switching and the end buffer 210 switching, the latter is longer, giving an overall settling time for this bus-turnaround switching of $2t_A+4t_C$.

Scheme-2 Termination Scheme Switching Scenarios, Unidirectional Mode

When one buffer switches from pulling high to pulling low, the settling time is $3t_A+t_B$.

More specifically, buffer A switches, launching a signal-edge of $-0.667*Vdd$ towards intersection I. After time $t_A$, $-0.667*Vdd$ edge arrives at intersection I. The amount reflected back towards A is $-0.333*(-0.667)*Vdd=+0.222*Vdd$, and the amount transmitted towards B and C is $+0.667*(-0.667)*Vdd=-0.444*Vdd$.

After time $t_A+t_B$, the $-0.444*Vdd$ edge propagating towards B arrives there and terminates. After time $t_A+t_C$, the $-0.444*Vdd$ edge propagating towards C arrives there and terminates. After time $t_A+t_A=2t_A$, the $+0.222*Vdd$ edge propagating towards A arrives there and reflects. The amount reflected back towards intersection I is $-0.333*(+0.222)*Vdd=-0.074*Vdd$ (since the reflection coefficient of buffer A is $-0.333$ in this case).

After time $2t_A+t_A=3t_A$, the $-0.074*Vdd$ edge arrives at intersection I. The amount reflected back towards A is $-0.333*(-0.074)*Vdd=+0.025*Vdd$, and the amount transmitted towards B and C is $+0.667*(-0.074)*Vdd=-0.050*Vdd$.

After time $3t_A+t_B$, the $-0.050*Vdd$ edge propagating towards B arrives there and terminates. After time $3t_A+t_C$, the $-0.050*Vdd$ edge propagating towards C arrives there and terminates. The edge propagating towards A cannot change the voltage at any node by as much as $0.050*Vdd$, so it is already defined to be settled.

Now there is no signal left propagating that can change the voltage at any node by as much as $0.050*Vdd$. Therefore, the line is defined as being settled. Since $(3t_A+t_B)>(3t_A+t_C)$, the settling time for this type of switching is $3t_A+t_B$.

When one buffer switches from pulling low to pulling high, the settling time is $2t_A$.

More specifically, buffer A switches, launching a signal-edge of $+0.750*Vdd$ towards intersection I. After time $t_A$, $+0.750*Vdd$ edge arrives at intersection I. The amount reflected back towards A is $-0.333*(+0.750)*Vdd=-0.250*Vdd$, and the amount transmitted towards B and C is $+0.667*(+0.750)*Vdd=+0.500*Vdd$.

After time $t_A+t_B$, the $+0.500*Vdd$ edge propagating towards B arrives there and terminates. After time $t_A+t_C$, the $+0.500*Vdd$ edge propagating towards C arrives there and terminates. After time $t_A+t_A=2t_A$, the $-0.250*Vdd$ edge propagating towards A arrives there and terminates (since the reflection coefficient of buffer A is 0 in this case).

Now there is no signal left propagating. Therefore, the line is defined as being settled. Since $(2t_A)>(t_A+t_B)>(t_A+t_C)$, the settling time for this type of switching is $2t_A$.

Scheme-2 Termination Scheme Switching Scenarios, Bus-turnaround Mode

When one buffer switches from pulling high to receive mode, and another buffer switches from receive mode to pulling high, neither switch launches a signal. So the settling time is 0.

When one buffer switches from pulling high to receive mode, and another buffer switches from receive mode to pulling low, the first buffer-switch launches no signal. The analysis for the second buffer-switch is the same as that when one buffer switches from pulling high to pulling low in uni-directional mode. So, the settling time is the same as for the latter $3t_A+t_B$.

When one buffer switches from pulling low to receive mode, and another buffer switches from receive mode to pulling high, the first buffer-switch has the same analysis as when one buffer switching from pulling low to pulling high in uni-directional mode. So, the settling time for this signal is $2t_A$. The second buffer-switch launches no signal. So, the overall settling-time for this bus-turnaround switching is: $2t_A$.

When one buffer switches from pulling low to receive mode, and another buffer switches from receive mode to pulling low, the settling time is $3t_A+t_B$.

Assume that buffer B is the one that switches from pulling low to receive mode, and buffer A is the one that switches from receive mode to pulling low.

Buffer B switches from pulling low to receive mode, launching a signal-edge of +0.750*Vdd towards intersection I. After time B, the +0.750*Vdd edge arrives at intersection I. The amount reflected back towards B is $-0.333*(+0.750)*Vdd=-0.250*Vdd$, and the amount transmitted towards A and C is $+0.667*(+0.750)*Vdd +0.500*Vdd$.

After time $t_B+t_B=2t_B$, the −0.250*Vdd edge propagating towards B arrives there and terminates. After time $t_B+t_C$, the +0.500*Vdd edge propagating towards C arrives there and terminates. After time $t_B+t_A$, the +0.500*Vdd edge propagating towards A arrives there and reflects. The amount reflected back towards intersection I is $-0.333*(+0.500)*Vdd=-0.167*Vdd$ (since the reflection coefficient of buffer A is −0.333 in this case)

After time $t_B+t_A+t_A=t_B+2t_A$, the −0.167*Vdd edge arrives at intersection I. The amount reflected back towards A is $-0.333*(-0.167)*Vdd=+0.056*Vdd$, and the amount transmitted towards B and C is $+0.667*(-0.167)*Vdd=-0.111*Vdd$.

After time $t_B+2t_A+t_B=2t_A+2t_B$, the −0.111*Vdd propagating towards B arrives and terminates. After time $t_B+2t_A+t_C$, the −0.111*Vdd edge propagating towards C arrives there and terminates. After time $t_B+2t_A+t_A=3t_A+t_B$, the 0.056*Vdd edge propagating towards A arrives and reflects. The amount reflected back towards intersection I is $-0.333*(+0.056)*Vdd=-0.019*Vdd$.

Now there is no signal left propagating that can change the voltage at any node by as much as 0.050*Vdd. Therefore, this signal is defined as being settled.

Since $(3t_A+t_B)>(2t_A+2t_B)>(t_A+2t_B+t_C)$, the settling time for this signal is $3t_A+t_B$.

(If it had been buffer A that did this switch, the A's and B's would be interchanged, and the largest settling time would be $(2t_A+2t_B)$, which is less than the settling time for buffer B doing this switch, $(3t_A+t_B)$. So, the maximum settling-time for this switch is $3t_A+t_B$.)

Buffer A switches from receive-mode to pulling low, launching a signal-edge of −0.500*Vdd towards intersection I. After time $t_A$, the −0.500*Vdd edge arrives at intersection I. The amount reflected back towards A is $-0.333*(-0.500)*Vdd=+0.167*Vdd$, and the amount transmitted towards B and C is $+0.667*(-0.500)*Vdd=-0.333*Vdd$.

After time $t_A+t_B$, the −0.333*Vdd edge arrives at B and terminates. After time $t_A+t_C$, the −0.333*Vdd edge propagating towards C arrives there and terminates. After time $t_A+t_A=2t_A$, the +0.167*Vdd edge propagating towards A arrives there and reflects. The amount reflected back towards intersection I is $-0.333*(+0.167)*Vdd=-0.056*Vdd$ (since the reflection coefficient of buffer A is −0.333 in this case)

The condition that no signal left propagating that can change the voltage at any node by as much as 0.050*Vdd is now achieved by time $2t_A$. The edge of −0.056*Vdd that was reflected from A towards intersection I is itself larger in magnitude than 0.050*Vdd, but since it has to impinge on intersection I before impinging on any nodes, the values of the voltages propagating after the −0.056*Vdd hits intersection I will all be less than 0.050*Vdd. So, the settling time for this is $2t_A$.

(If it had been Buffer B that did this switch, the resulting settling times would have been $(t_A+t_B)$, $(2t_B)$, and $(t_B+t_C)$, all of which are less than $(2t_A)$. So the maximum settling time for this switch is $2t_A$. The overall settling time for this bus-turnaround switching is the larger of the two settling times, which is $3t_A+t_B$.)

Referring to Table 1, a comparison of the settling times between Scheme-1 Termination and Scheme-2 Termination will now be discussed. Comparing the results for all of the switching scenarios, maximum settling-times for the Scheme-1 Termination scheme and Scheme-2 Termination scheme and their two switching-types are:

TABLE 1

|  | Uni-Directional | Bus-Turnaround |
| --- | --- | --- |
| Scheme-1 Termination: | $2t_A + 4t_C$ | $2t_A + 4t_C$ |
| Scheme-2 Termination: | $3t_A + t_B$ | $3t_A + t_B$ |

The maximum settling-time for uni-directional switching was the same as for bus-turnaround switching for both termination schemes. The settling time for Scheme-1 Termination will be less than that for Scheme-2 Termination when $(2t_A+4t_C)<(3t_A+t_B)$, which, after rearrangement, means $t_C<(t_A+t_B)/4$. Since the propagation times $t_A$, $t_B$, $t_C$ are related to lengths $L_A$, $L_B$, $L_C$, if $L_C$ is very short relative to $L_A+L_B$ (specifically $L_C<(L_A+L_B)/4$), then the Scheme-1 Termination Scheme settles sooner, otherwise the Scheme-2 Termination scheme settles sooner.

For a given termination scheme, it is possible to adjust the line lengths $L_A$, $L_B$ and $L_C$ so as to effect a change on settling time.

More specifically, for Scheme-1 Termination scheme the settling time can be minimized by adjusting the line lengths to minimize the sum to $2L_A+4L_C$, assuming that after such a change $L_A>L_B>L_C$. Note that a given absolute change in length $L_C$ provides twice the impact on settling time as the same absolute change in length $L_A$. A change in the length $L_B$ does not affect the settling time at all (again, as long as the relationship $L_A>L_B>L_C$ remains valid).

For Scheme-2 Termination scheme the settling time can be minimized by adjusting the line lengths to minimize the sum to $3L_A+L_B$, assuming that after such a change $L_A>L_B>L_C$. Note that, a given absolute change in length $L_A$ will have three times the impact on settling time as the same absolute change in length $L_B$. A change in length $L_C$ does not affect the settling time at all (again, as long as the relationship $L_A > L_B > L_C$ remains valid).

Figure 3:
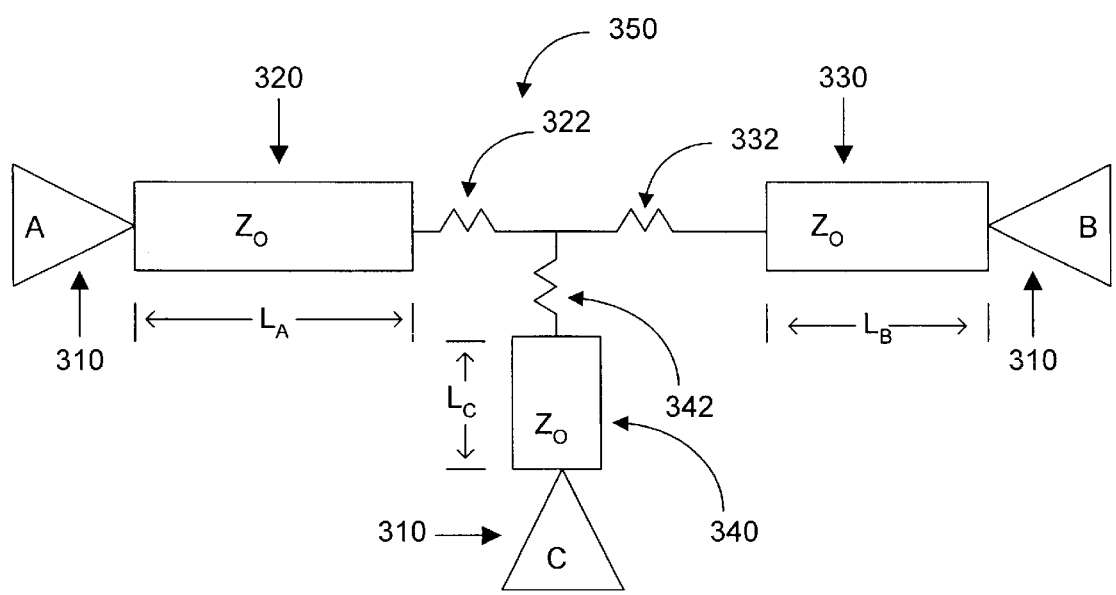
FIG. 3 is a block diagram of a three node system which implements a Scheme-3 Termination scheme.

Referring to FIG. 3, another system-implementation using Dynamic Termination Logic, called Scheme-3 Termination, will now be discussed. In this implementation, transmission line 320 is coupled between buffer A and resistor 322. Transmission line 330 is coupled between buffer B and resistor 332, and transmission line 340 is coupled between buffer C and resistor 342. Resistors 322, 332 and 342 provide a network of resistors 350. The ends opposite the transmission lines of resistors 322, 332, 342 are coupled together at intersection I. The network of resistors at intersection I prevent any reflections from intersection I. (However, there is voltage-drop across the resistor network, so the signals arriving at the receiving ends are of reduced amplitude relative to the signal at the driving end.) The output buffers 310 are configured similarly to those in a Scheme-2 Termination scheme, except that the pull-down resistance is very small to achieve voltage swings approaching Vdd/2. More specifically, for a desired voltage-swing, $V_{swing}$ at the receiving end, the output-resistance of the pull-down element must be: $Z_0*(Vdd-2*V_{swing})/(2*V_{swing})$. Additionally, the lengths of the transmission lines are assumed to be $L_A > L_B > L_C$.

Output Buffers 310 are equivalent, i.e., $R_{pullup} = Z_0$, $R_{pulldown} = Z_0*(Vdd-2*V_{swing})/(2*V_{swing})$. When receiving, the pull-up is active (acts as terminator). Resistors 322, 332, 342 are equivalent, each having a resistance $R_j = Z_0/3$ resistance, and thus no reflections from the junction occur.

Since $R_{pulldown}$ must be very small for $V_{swing}$ to approach Vdd/2, the reflection coefficient for signals propagating on the transmission-line that impinge on the interface between an end of the transmission line and a driver that is pulling low must approach $-1$. Otherwise, the reflection coefficients are the same for Scheme-2 Termination scheme.

For unidirectional signaling, signals propagate to the receiving nodes and terminate there. So, the maximum settling time for Scheme-3 Termination uni-directional signaling is $t_A + t_B$.

Bus-turnaround signaling will differ in settling-time from unidirectional signaling only for the case in which one buffer switches from pulling low to receive mode, and another buffer switches from receive mode to pulling low. Signals launched by the first switch will be reflected at the node where the output buffer is pulling low, since the pull-down output resistance is not matched to the impedance of the transmission line. Reflected signals propagate (without reflection) through the junction (suffering a drop in amplitude there) and terminate at the receiving nodes. Therefore, the maximum settling time for Scheme-3 Termination bus-turnaround signaling $2t_A + 2t_B$.

Referring to Table 2, a comparison of the settling times between the Scheme-1 Termination scheme, Scheme-2 Termination scheme, and the Scheme-3 Termination scheme will now be discussed.

Comparing the results for all of the switching scenarios, maximum settling-times are:

TABLE 2

|  | Uni-Directional | Bus-Turnaround |
|---|---|---|
| Scheme-1 Termination: | $2t_A + 4t_C$ | $2t_A + 4t_C$ |
| Scheme-2 Termination: | $3t_A + t_B$ | $3t_A + t_B$ |
| Scheme-3 Termination: | $t_A + t_B$ | $2t_A + 2t_B$ |

So, Scheme-3 Termination will have the minimum settling time for uni-directional signaling in all cases. If bus-turnaround signaling is considered, the maximum settling-time for Scheme-3 Termination is always less than that for Scheme-2 Termination, since $(2t_A + 2t_B) < (3t_A + t_B)$ always. As shown previously, a Scheme-1 Termination scheme will settle sooner than a Scheme-2 Termination scheme if $t_C < (t_A + t_B)/4$. A Scheme-3 Termination scheme will settle sooner than a Scheme-1 Termination scheme if $(2t_A + 2t_B) < (2t_A + 4t_C)$, meaning $t_B/2 < t_C$.

Table 3, below, summarizes these resulting relationships between settling times for bus-turnaround switching for the three DTL Schemes based on the relative lengths of the transmission-line segments.

TABLE 3

| Relative Lengths of Transmission-Line Segments | Shortest Settling Time | Second-Shortest Settling Time | Longest Settling Time |
|---|---|---|---|
| $L_C > (L_A + L_B)/4$ | Scheme-3 Termination | Scheme-2 Termination | Scheme-1 Termination |
| $L_B/2 < L_C < (L_A + L_B)/4$ | Scheme-3 Termination | Scheme-1 Termination | Scheme-2 Termination |
| $L_C < L_B/2$ | Scheme-1 Termination | Scheme-3 Termination | Scheme-2 Termination |

As for Scheme-1 Termination scheme and Scheme-2 Termination scheme, for the Scheme-3 Termination scheme, it is also possible to adjust the line lengths $L_A$, $L_B$ and $L_C$ so as to effect a change on settling time.

More specifically, the settling time can be minimized by adjusting the line lengths to minimize the sum of $L_A + L_B$ (which also minimizes $2L_A + 2L_B$), assuming that after such a change $L_A > L_B > L_C$. Note that a given absolute change in length $L_A$ provides the same the impact on settling time as the same absolute change in length $L_B$. A change in the length $L_C$ does not affect the settling time at all (again, as long as the relationship $L_A > L_B > L_C$ remains valid).

What is claimed is:

1. A method of selecting a termination scheme from a first transmission scheme and a second transmission scheme to minimize signal settling time in a three node system having first, second and third transmission lines connected at a junction comprising:

determining a first transmission line length of the first transmission line;

determining a second transmission line length of the second transmission line;

determining a third transmission line length of the third transmission line, the first transmission line length being greater than the second transmission line length and the second transmission line length being greater than the third transmission line length;

selecting the first termination scheme if the third transmission line length is short relative to the combination of the first transmission line length plus the second transmission line length, otherwise selecting the second termination scheme.

2. The method of claim 1 wherein the first termination scheme is selected when the third transmission line length is less than one fourth the quantity of the second transmission line length plus the first transmission line length.

3. The method of claim 1 wherein the three node system includes:

a first output buffer coupled to an end of the first transmission line, the first output buffer having a pull-up element and a pull down element;

a second output buffer coupled to an end of the second transmission line, the second output buffer having a pull-up element and a pull down element; and, a third output buffer coupled to an end of the third transmission line, the third output buffer having a pull-up element and a pull down element.

4. The method of claim 3 wherein:

the first, second and third transmission lines each have a characteristic line impedance.

5. The method of claim 4 wherein, for the first termination scheme, the first, second and third output buffer pull-up elements each have a resistance that substantially corresponds to the characteristic line impedance; and the first and second output buffer pull-down elements each have a resistance that substantially corresponds to the characteristic line impedance;

the third output buffer pull-down element has a resistance that substantially corresponds to the characteristic line impedance divided by two;

the pull-up element of the first output buffer is active when the first output buffer is driving high, the pull down element of the first output buffer is active when the first output buffer is driving low, the pull-up element of the first output buffer is active when the first output buffer is receiving;

the pull-up element of the second output buffer is active when the second output buffer is driving high, the pull down element of the second output buffer is active when the second output buffer is driving low, the pull-up element of the second output buffer is active when the second output buffer is receiving, the pull-up element of the third output buffer is active when the third output buffer is driving high, the pull down element of the third output buffer is active when the third output buffer is driving low, the pull-up element and the pull-down element of the third output buffer are off when the third output buffer is receiving.

6. The method of claim 4 wherein, for the second termination scheme, the first, second and third output buffer pull-up elements each have a resistance that substantially corresponds to the characteristic line impedance; and the first, second and third output buffer pull-down elements each have a resistance that substantially corresponds to the characteristic line impedance divided by two;

the pull-up element of the first output buffer is active when the first output buffer is driving high, the pull down element of the first output buffer is active when the first output buffer is driving low, the pull-up element of the first output buffer is active when the first output buffer is receiving;

the pull-up element of the second output buffer is active when the second output buffer is driving high, the pull down element of the second output buffer is active when the second output buffer is driving low, the pull-up element of the second output buffer is active when the second output buffer is receiving, the pull-up element of the third output buffer is active when the third output buffer is driving high, the pull down element of the third output buffer is active when the third output buffer is driving low, the pull-up buffer of the third output buffer is active when the third output buffer is receiving.

7. A method of selecting a termination scheme from a first termination scheme, a second termination scheme and a third termination scheme to minimize signal settling time in a three node system having first, second and third transmission lines connected at a junction comprising:

determining a first transmission line length of the first transmission line;

determining a second transmission line length of the second transmission line;

determining a third transmission line length of the third transmission line;

selecting the first termination scheme if the third transmission line length is less than half of the second transmission line length, otherwise selecting the first termination scheme.

8. The method of claim 7 wherein the three node system includes:

a first output buffer coupled to an end of the first transmission line, the first output buffer having a pull-up element and a pull down element;

a second output buffer coupled to an end of the second transmission line, the second output buffer having a pull-up element and a pull down element;

a third output buffer coupled to an end of the third transmission line, the third output buffer having a pull-up element and a pull down element.

9. The method of claim 8 wherein:

the first, second and third transmission lines each have a characteristic line impedance.

10. The method of claim 9 wherein, for the first termination scheme, the first, second and third output buffer pull-up elements each have a resistance that substantially corresponds to the characteristic line impedance; and the first and second output buffer pull-down elements each have a resistance that substantially corresponds to the characteristic line impedance;

the third output buffer pull-down element has a resistance that substantially corresponds to the characteristic line impedance divided by two;

the pull-up element of the first output buffer is active when the first output buffer is driving high, the pull down element of the first output buffer is active when the first output buffer is driving low, the pull-up element of the first output buffer is active when the first output buffer is receiving;

the pull-up element of the second output buffer is active when the second output buffer is driving high, the pull down element of the second output buffer is active when the second output buffer is driving low, the pull-up element of the second output buffer is active when the second output buffer is receiving, the pull-up element of the third output buffer is active when the third output buffer is driving high, the pull down element of the third output buffer is active when the third output buffer is driving low, the pull-up element and the pull-down element of the third output buffer are off when the third output buffer is receiving.

11. The method of claim 9 wherein, for the second termination scheme, the first, second and third output buffer pull-up elements each have a resistance that substantially corresponds to the characteristic line impedance; and the first, second and third output buffer pull-down elements each have a resistance that substantially corresponds to the characteristic line impedance divided by two;

the pull-up element of the first output buffer is active when the first output buffer is driving high, the pull down element of the first output buffer is active when the first output buffer is driving low, the pull-up element of the first output buffer is active when the first output buffer is receiving;

the pull-up element of the second output buffer is active when the second output buffer is driving high, the pull down element of the second output buffer is active when the second output buffer is driving low, the pull-up element of the second output buffer is active when the second output buffer is receiving, the pull-up element of the third output buffer is active when the third output buffer is driving high, the pull down element of the third output buffer is active when the third output buffer is driving low, the pull-up buffer of the third output buffer is active when the third output buffer is receiving.

12. The method of claim 9 wherein the third termination scheme further comprises:

a plurality of network resistors at an intersection of the nodes, a first end of each resistor in the plurality of network resistors being coupled at an intersection, another end of each resistor being coupled to another end of a respective transmission line.

13. The method of claim 12 wherein each resistor in the plurality of network resistors has a resistance substantially equal to the characteristic line impedance divided by three.

14. The method of claim 12 wherein, for the third termination scheme:

the first, second and third output buffer pull-up elements each have a resistance that substantially corresponds to the characteristic line impedance; and the first, second and third output buffer pull-down elements each have a resistance that is small.

15. The method of claim 14 wherein, for the third termination scheme, the pull-up element of the first output buffer is active when the first output buffer is driving high, the pull down element of the first output buffer is active when the first output buffer is driving low, the pull-up element of the first output buffer is active when the first output buffer is receiving;

the pull-up element of the second output buffer is active when the second output buffer is driving high, the pull down element of the second output buffer is active when the second output buffer is driving low, the pull-up element of the second output buffer is active when the second output buffer is receiving, the pull-up element of the third output buffer is active when the third output buffer is driving high, the pull down element of the third output buffer is active when the third output buffer is driving low, the pull-up buffer of the third output buffer is active when the third output buffer is receiving.

16. A method of adjusting line lengths in a three node system to minimize signal settling time comprising:

determining whether a first or second termination scheme is used by the three node system;

determining a first transmission line length of a first transmission line;

determining a second transmission line length of a second transmission line;

determining a third transmission line length of a third transmission line, the first transmission line length being greater than the second transmission line length and the second transmission line length being greater than the third transmission line length;

adjusting, when the first termination scheme is used, the first transmission line length, the second transmission line length and the third transmission line length to minimize the sum of two times the first transmission line length plus four times the third transmission line length; and adjusting, when the second termination scheme is used, the first transmission line length, the second transmission line length and the third transmission line length to minimize the sum of three times the first transmission line length plus the second transmission line length; and maintaining, when adjusting, the first transmission line length greater than the second transmission line length and the second transmission line length greater than the third transmission line length.

17. The method of claim 16 wherein the three node system includes:

a first output buffer coupled to an end of the first transmission line, the first output buffer having a pull-up element and a pull down element;

a second output buffer coupled to an end of the second transmission line, the second output buffer having a pull-up element and a pull down element; and, a third output buffer coupled to an end of the third transmission line, the third output buffer having a pull-up element and a pull down element.

18. The method of claim 17 wherein:

the first, second and third transmission lines each have a characteristic line impedance.

19. The method of claim 18 wherein, for the first termination scheme, the first, second and third output buffer pull-up elements each have a resistance that substantially corresponds to the characteristic line impedance; and the first and second output buffer pull-down elements each have a resistance that substantially corresponds to the characteristic line impedance;

the third output buffer pull-down element has a resistance that substantially corresponds to the characteristic line impedance divided by two;

the pull-up element of the first output buffer is active when the first output buffer is driving high, the pull down element of the first output buffer is active when the first output buffer is driving low, the pull-up element of the first output buffer is active when the first output buffer is receiving;

the pull-up element of the second output buffer is active when the second output buffer is driving high, the pull down element of the second output buffer is active when the second output buffer is driving low, the pull-up element of the second output buffer is active when the second output buffer is receiving, the pull-up element of the third output buffer is active when the third output buffer is driving high, the pull down element of the third output buffer is active when the third output buffer is driving low, the pull-up element and the pull-down element of the third output buffer are off when the third output buffer is receiving.

20. The method of claim 18 wherein, for the second termination scheme, the first, second and third output buffer pull-up elements each have a resistance that substantially corresponds to the characteristic line impedance; and the first, second and third output buffer pull-down elements each have a resistance that substantially corresponds to the characteristic line impedance divided by two;

the pull-up element of the first output buffer is active when the first output buffer is driving high, the pull down element of the first output buffer is active when the first output buffer is driving low, the pull-up element of the first output buffer is active when the first output buffer is receiving;

the pull-up element of the second output buffer is active when the second output buffer is driving high, the pull down element of the second output buffer is active when the second output buffer is driving low, the pull-up element of the second output buffer is active when the second output buffer is receiving, the pull-up element of the third output buffer is active when the third output buffer is driving high, the pull down element of the third output buffer is active when the third output buffer is driving low, the pull-up buffer of the third output buffer is active when the third output buffer is receiving.

21. A method of adjusting line lengths in a three node system to minimize signal settling time comprising:

determining whether a first termination scheme, a second termination, or a third termination scheme is used by the three node system;

determining a first transmission line length of a first transmission line;

determining a second transmission line length of a second transmission line;

determining a third transmission line length of a third transmission line, the first transmission line length being greater than the second transmission line length and the second transmission line length being greater than the third transmission line length;

adjusting, when the first termination scheme is used, the first transmission line length, the second transmission line length and the third transmission line length to minimize the sum of two times the first transmission line length plus four times the third transmission line length;

adjusting, when the second termination scheme is used, the first transmission line length, the second transmission line length and the third transmission line length to minimize the sum of three times the first transmission line length plus the second transmission line length; and, adjusting, when the third termination scheme is used, the first transmission line length, the second transmission line length and the third transmission line length to minimize the sum of the first transmission line length plus the second transmission line length; and maintaining, when adjusting, the first transmission line length greater than the second transmission line length and the second transmission line length greater than the third transmission line length.

22. The method of claim 21 wherein the three node system includes:

a first output buffer coupled to an end of the first transmission line, the first output buffer having a pull-up element and a pull down element;

a second output buffer coupled to an end of the second transmission line, the second output buffer having a pull-up element and a pull down element;

a third output buffer coupled to an end of the third transmission line, the third output buffer having a pull-up element and a pull down element.

23. The method of claim 22 wherein:

the first, second and third transmission lines each have a characteristic line impedance.

24. The method of claim 23 wherein, for the first termination scheme, the first, second and third output buffer pull-up elements each have a resistance that substantially corresponds to the characteristic line impedance; and the first and second output buffer pull-down elements each have a resistance that substantially corresponds to the characteristic line impedance;

the third output buffer pull-down element has a resistance that substantially corresponds to the characteristic line impedance divided by two;

the pull-up element of the first output buffer is active when the first output buffer is driving high, the pull down element of the first output buffer is active when the first output buffer is driving low, the pull-up element of the first output buffer is active when the first output buffer is receiving;

the pull-up element of the second output buffer is active when the second output buffer is driving high, the pull down element of the second output buffer is active when the second output buffer is driving low, the pull-up element of the second output buffer is active when the second output buffer is receiving, the pull-up element of the third output buffer is active when the third output buffer is driving high, the pull down element of the third output buffer is active when the third output buffer is driving low, the pull-up element and the pull-down element of the third output buffer are off when the third output buffer is receiving.

25. The method of claim 23 wherein, for the second termination scheme, the first, second and third output buffer pull-up elements each have a resistance that substantially corresponds to the characteristic line impedance; and the first, second and third output buffer pull-down elements each have a resistance that substantially corresponds to the characteristic line impedance divided by two;

the pull-up element of the first output buffer is active when the first output buffer is driving high, the pull down element of the first output buffer is active when the first output buffer is driving low, the pull-up element of the first output buffer is active when the first output buffer is receiving;

the pull-up element of the second output buffer is active when the second output buffer is driving high, the pull down element of the second output buffer is active when the second output buffer is driving low, the pull-up element of the second output buffer is active when the second output buffer is receiving, the pull-up element of the third output buffer is active when the third output buffer is driving high, the pull down element of the third output buffer is active when the third output buffer is driving low, the pull-up buffer of the third output buffer is active when the third output buffer is receiving.

26. The method of claim 23 wherein the third termination scheme further comprises:

a plurality of network resistors at an intersection of the nodes, a first end of each resistor in the plurality of network resistors being coupled at an intersection, another end of each resistor being coupled to another end of a respective transmission line.

27. The method of claim 26 wherein each resistor in the plurality of network resistors has a resistance substantially equal to the characteristic line impedance divided by three.

28. The method of claim 26 wherein, for the third termination scheme:

the first, second and third output buffer pull-up each elements have a resistance that substantially corresponds to the characteristic line impedance; and the first, second and third output buffer pull-down elements each have a resistance that is small.

29. The method of claim 28 wherein, the first, second and third output buffer pull-down elements each have a resistance that is substantially equal to $Z_0*(Vdd-2*V_{swing})/(2*V_{swing})$.

30. The method of claim 28 wherein, for the third termination scheme, the pull-up element of the first output buffer is active when the first output buffer is driving high, the pull down element of the first output buffer is active when the first output buffer is driving low, the pull-up element of the first output buffer is active when the first output buffer is receiving;

the pull-up element of the second output buffer is active when the second output buffer is driving high, the pull down element of the second output buffer is active when the second output buffer is driving low, the pull-up element of the second output buffer is active when the second output buffer is receiving, the pull-up element of the third output buffer is active when the third output buffer is driving high, the pull down element of the third output buffer is active when the third output buffer is driving low, the pull-up buffer of the third output buffer is active when the third output buffer is receiving.

* * * * *